(12) United States Patent
Schoenberger

(10) Patent No.: US 7,394,312 B2
(45) Date of Patent: Jul. 1, 2008

(54) RE-CONFIGURABLE AMPLIFIER PROTECTION APPARATUS AND METHOD

(75) Inventor: Michael A. Schoenberger, Cincinnati, OH (US)

(73) Assignee: Pioneer Corporation, Meguro-ku (JP)

( * ) Notice: Subject to any disclaimer, the term of this patent is extended or adjusted under 35 U.S.C. 154(b) by 154 days.

(21) Appl. No.: 11/164,201

(22) Filed: Nov. 14, 2005

(65) Prior Publication Data

US 2006/0103467 A1  May 18, 2006

Related U.S. Application Data

(60) Provisional application No. 60/628,193, filed on Nov. 15, 2004.

(51) Int. Cl.
*H03F 1/14* (2006.01)
*H03F 1/52* (2006.01)

(52) U.S. Cl. ..................... 330/51; 330/207 P
(58) Field of Classification Search ............ 330/207 P, 330/298
See application file for complete search history.

(56) References Cited

U.S. PATENT DOCUMENTS

| | | | | |
|---|---|---|---|---|
| 4,173,739 A | 11/1979 | Yoshida | ............. | 330/298 |
| 4,216,517 A | 8/1980 | Takahashi | ............. | 330/207 P |
| 4,455,534 A * | 6/1984 | Gillig | ............. | 330/51 |
| 5,847,610 A | 12/1998 | Fujita | | |
| 6,621,336 B1 | 9/2003 | Johnson | | |
| 6,806,766 B2 | 10/2004 | Hasegawa | ............. | 330/9 |
| 2004/0135635 A1 | 7/2004 | Noro | | |

FOREIGN PATENT DOCUMENTS

DE    44 33 528 A1    3/1995

* cited by examiner

*Primary Examiner*—Steven J Mottola
(74) *Attorney, Agent, or Firm*—Steve A. Wong

(57) ABSTRACT

The present invention is directed to an amplifier, which is able to re-configure its internal protection circuits based on an output signal level. This allows the amplifier to apply the best protection level to the present operational condition. The protection level or threshold for protecting the amplifier is dynamically adjusted to a lower threshold level, thereby making it more sensitive in certain operating scenarios. In one embodiment of the present invention, a first current protection threshold is used to operate an amplifier in a first state. If an event occurs, the amplifier protection circuit is re-configured and the amplifier continues to operate with a second protection threshold in a second state.

12 Claims, 7 Drawing Sheets

RE-CONFIGURABLE AMPLIFIER PROTECTION APPARATUS AND METHOD

CROSS-REFERENCE TO RELATED APPLICATIONS

This application herein incorporates by reference and claims the benefit of U.S. Provisional Application Ser. No. 60/628,193, filed on Nov. 15, 2004, entitled Dynamic Amplifier Protection (DAP) Technology.

NOTICE OF MATERIAL SUBJECT TO COPYRIGHT PROTECTION

All of the material in this patent document is subject to copyright protection under the copyright laws of the United States and of other countries. Portions of the material in this patent document are also subject to protection under the maskwork registration laws of the United States and of other countries. The owner of the copyright and maskwork rights has no objection to the facsimile reproduction by anyone of the patent document or the patent disclosure, as it appears in the United States Patent and Trademark Office file or records, but otherwise reserves all copyright and maskwork rights whatsoever.

BACKGROUND OF THE INVENTION

1. Field of the Invention

The present invention relates to a protection circuit for an amplification device.

2. Background of the Invention

Typically, amplifiers use a constant protection level or "threshold". When the threshold is exceeded a protection circuit is invoked, which shuts down the amplifier or otherwise causes it to protect itself from permanent damage. The protection threshold needs to be placed outside the extreme limit of operation of the amplifier to prevent its unintentional activation during normal usage.

The problem with currently available protection techniques is that fault conditions also occur in scenarios where the protection threshold is not exceeded. One such scenario is when the system is driving a short, during low output levels. Under conditions when the output voltage is high, the modulation level of the amplifier is also high. In this case, the system runs efficiently, so a large input current being carried through the system is not a problem. Under conditions when the output voltage is low, the modulation level of the amplifier is also low. In this case, the system runs inefficiently, so a large current being carried through the system may be a problem.

A short circuit condition, when it occurs at a time when the output voltage is high, is typically not a problem because the system can handle a high current surge when it is running efficiently and it will shut down, because in this condition, prior art current protection thresholds are designed to shut the amplifier off.

However, a short circuit condition, when it occurs at a time when the output voltage is low, may be a problem. When the output voltage is low, the output modulation level is also low. This causes the system to run inefficiently. Moreover, during this condition the current will not be high enough to reach prior art protection thresholds, so the system will not shut down. Since the system is running inefficiently in the latter short circuit condition and will not shut down, and at the same time sourcing a high current, the system components overheat, and/or become damaged.

In many of these cases the eventual destruction of the amplifier will occur due to excess power dissipation in the amplifier output section. For example, if the speaker output is shorted during a low output level or low volume, the amplifier might not reach its protection level and never invoke the protection circuit.

Therefore, the amplifier will continue to operate in this fault condition, which may cause excessive power dissipation within the amplifier and its failure, despite having a protection circuit with a protection threshold in place.

BRIEF DESCRIPTION OF THE DRAWINGS

The invention will be more fully understood by reference to the following drawings, which are for illustrative purposes only.

SUMMARY OF THE INVENTION

The present invention is for an amplifier, which is able to re-configure its internal protection circuits based on an output signal level. This allows the amplifier to apply the best protection level to the present operational condition. The protection level or threshold for protecting the amplifier is dynamically adjusted to a lower threshold level, thereby making it more sensitive in certain operating scenarios.

In one embodiment of the present invention, a first current protection threshold is used to operate an amplifier in a first state. If an event occurs, the amplifier protection circuit is re-configured and the amplifier continues to operate with a second protection threshold in a second state. In other embodiments, more then two states are used in conjunction with more than two thresholds.

DETAILED DESCRIPTION OF THE INVENTION

The present invention is directed to an amplifier, which is able to re-configure its internal protection circuits based on an output signal level. This allows the amplifier to apply the best protection level to the present operational condition. The protection level or "threshold" for protecting the amplifier is dynamically adjusted to a lower threshold level, thereby making it more sensitive in certain operating scenarios.

The protection circuitry of the present invention avoids problems with phase relationship and is compatible, for instance, with Class-D amplifiers. In one aspect of the invention, the circuitry measures the output signal as an average, which makes it easier to compare to references. In another aspect of the invention, the sensitivity of the circuitry changes in discrete intervals, which readily allows the use of references for control. In yet another aspect of the invention, current is measured on the battery input line, which is a low voltage.

Figure 1:
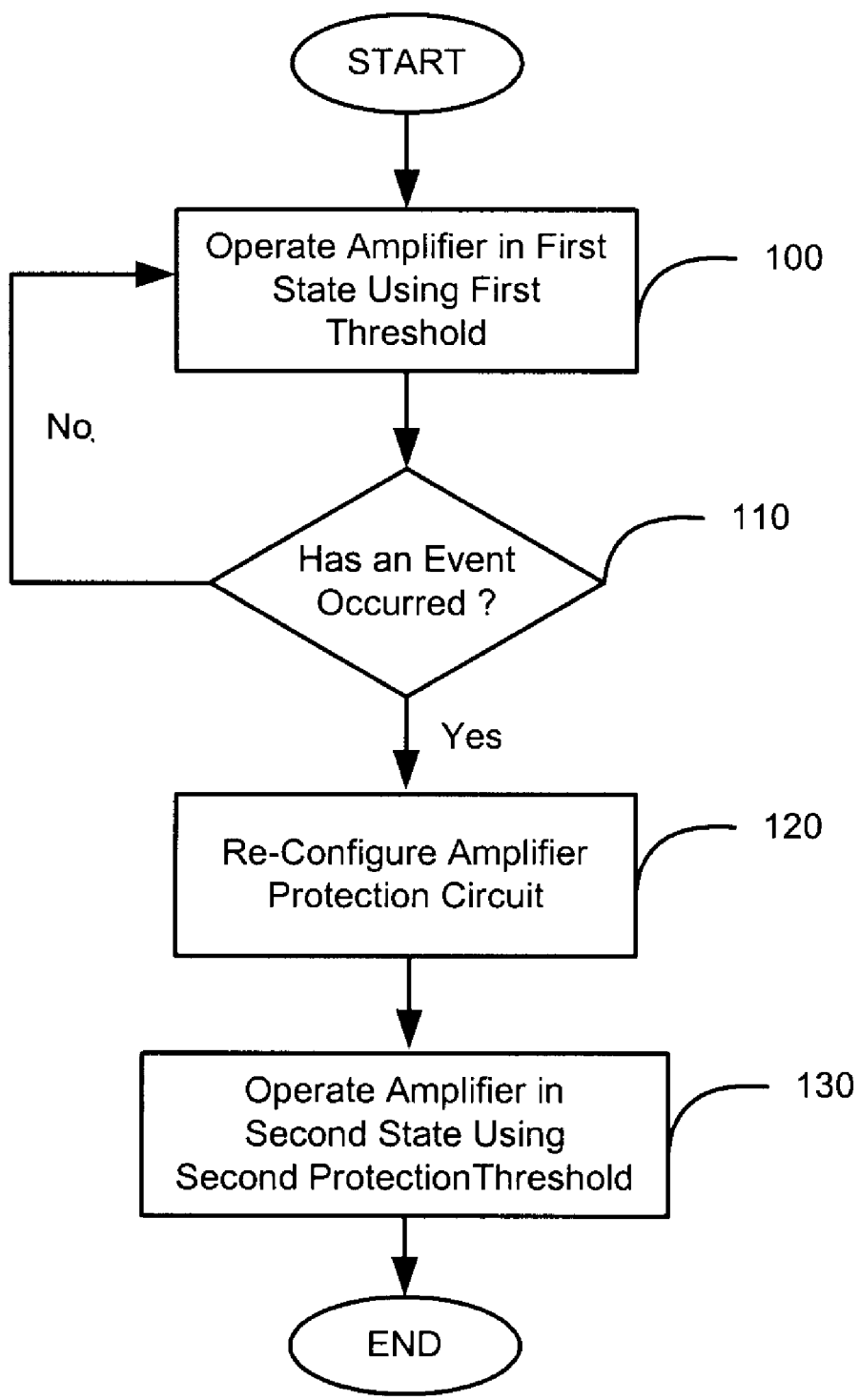
FIG. 1 is a flowchart showing the operation of an embodiment of the present invention.

FIG. 1 shows the operation of an embodiment of the present invention. At step 100, a first current protection threshold is used to operate an amplifier in a first state. At step 110, it is determined if an event has occurred. One example of an event, for the purpose of this invention, is when the output current of an amplifier exceeds a pre-determined current threshold. If the event has not happened, the amplifier continues to operate in the first state and step 100 repeats. When the event occurs, the circuit is amplifier protection circuit is re-configured at step 120. At step 130, the amplifier continues to operate with a second protection threshold in a second state.

It should be understood by one having ordinary skill in the art that the present invention is not limited to two states, but operates using in any number of states depending on the needs of the system and the structure of the amplifier. There are many scenarios where more states are needed to prevent the protection circuit from interfering with normal operating conditions or to increase the protection margin. In such scenarios the same procedures taught by the present invention should be repeated for the additional states.

Figure 2:
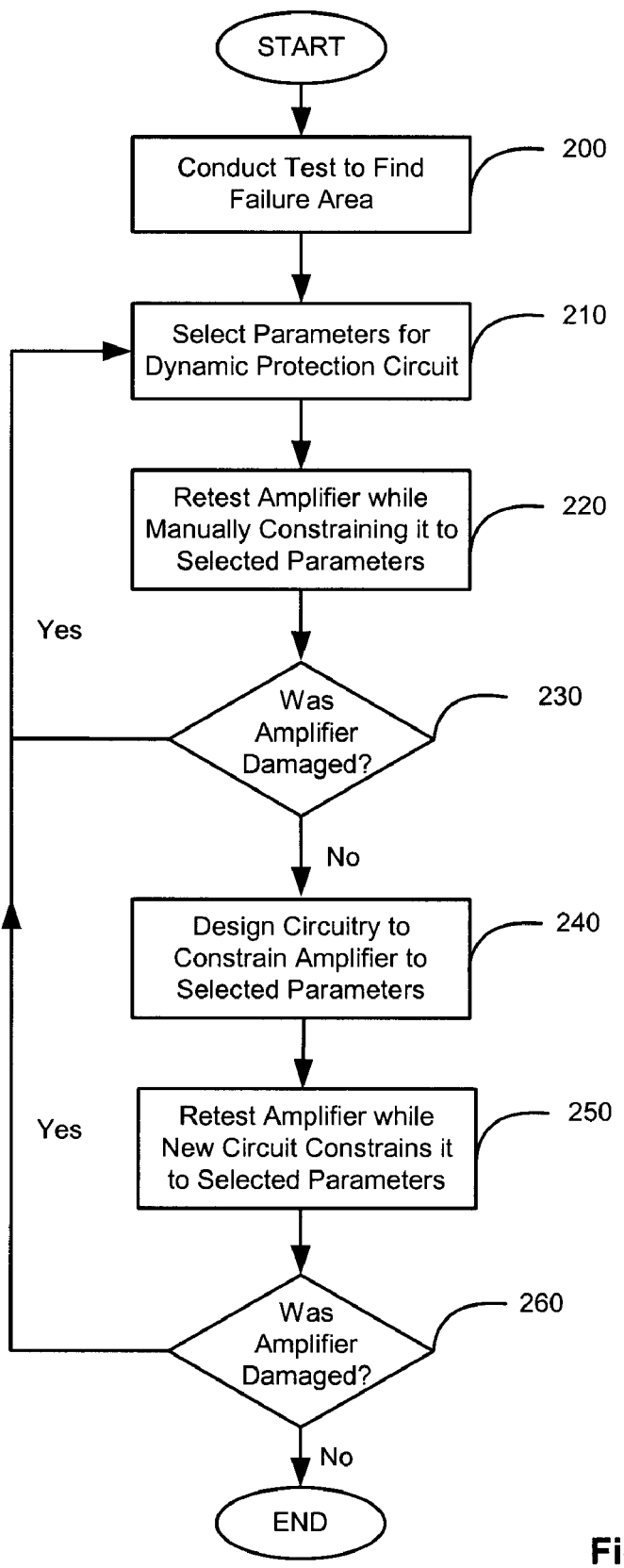
FIG. 2 is a flowchart showing a method for designing a re-configurable amplifier protection circuit according to an embodiment of the present invention.

FIG. 2 shows a method for setting up a re-configurable amplifier protection apparatus according to an embodiment of the invention. At step 200, tests are conducted to find a failure area. At step 210, parameters for the re-configurable or "dynamic" protection circuit are selected. At step 220, the amplifier is re-tested, while constraining it manually to the selected parameters. At step 230, it is determined whether the amplifier was damaged. Damaged constitutes causing the amplifier to cease to function as it was intended. If damage occurred, step 210 repeats until appropriate parameters are selected, which do not damage the amplifier.

If at step 230, the amplifier was not damaged, then at step 240, circuitry is designed to constrain the amplifier to the located parameters. At step 250, the amplifier is re-tested, while the designed circuitry constrains it to the selected parameters. At step 260, it is determined whether the amplifier was damaged during testing. If so, step 210 repeats again and new parameters are located. Otherwise, the system operated successfully and the process is complete.

In order to find the failure areas used by a re-configurable amplifier protection circuit according to an embodiment of the present invention, as described in step 200 of FIG. 2, fault conditions that occur while driving a shorted speaker or speaker wire at low volume levels are reproduced. In one embodiment, the system is tested with the following setups: 1) a shorted 5 meter 12 AWG speaker wire; 2) a shorted 5 meter 10 AWG speaker wire; and 3) a shorted speaker sample. In other embodiments, more setups are used or different setups are used depending on the amplifier type that is under testing.

Figure 3:
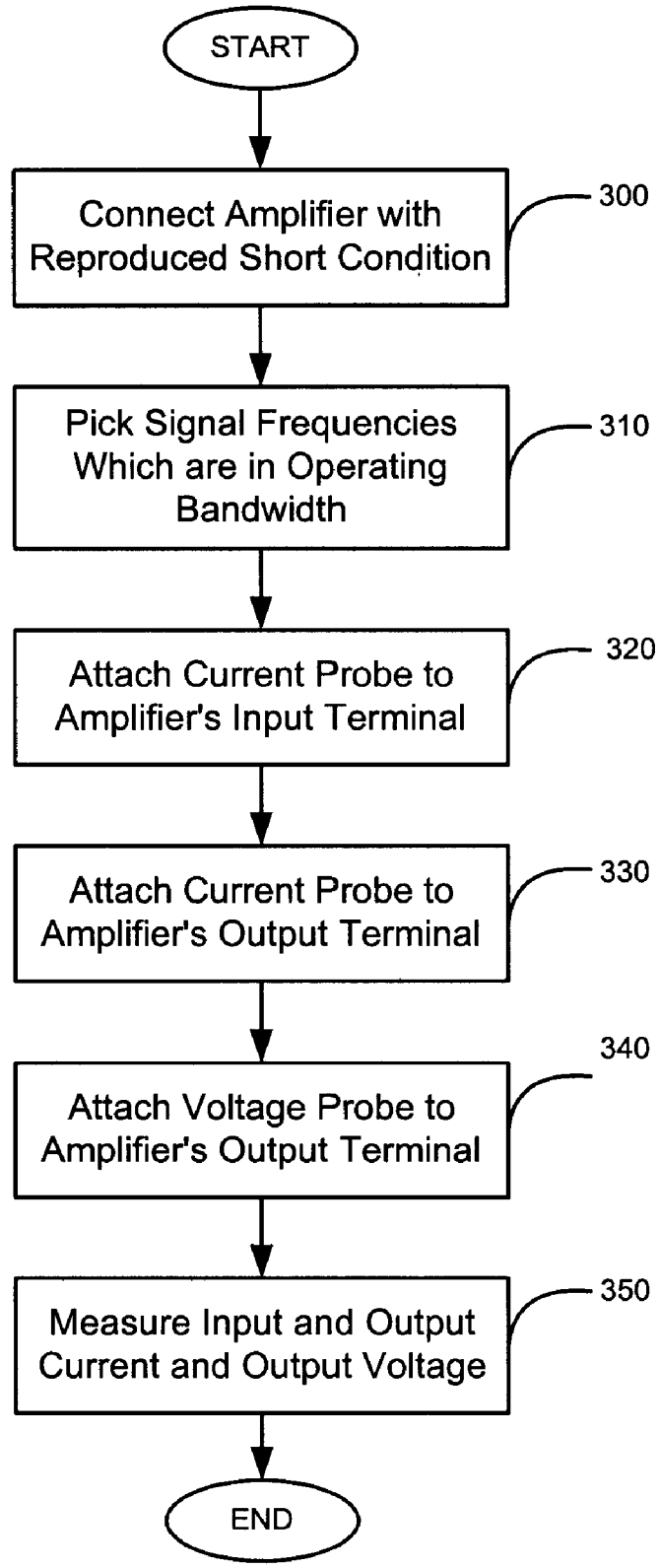
FIG. 3 is a flowchart showing how to find the failure areas used by a re-configurable amplifier protection circuit according to an embodiment of the present invention.

FIG. 3 is a diagram showing how to find the failure areas used by a re-configurable amplifier protection circuit according to an embodiment of the present invention. At step 300, the amplifier is connected with a reproduced short condition. At step 310, signal frequencies are picked, which are within the amplifier's operating bandwidth. At step 320, a current probe is attached to the amplifier's input terminal. At step 330, a current probe is attached to the amplifier's output terminal. At step 340, a voltage probe is attached to the amplifier's output terminal. At step 350, measurements are taken of the input and output current and the output voltage.

Figure 4:
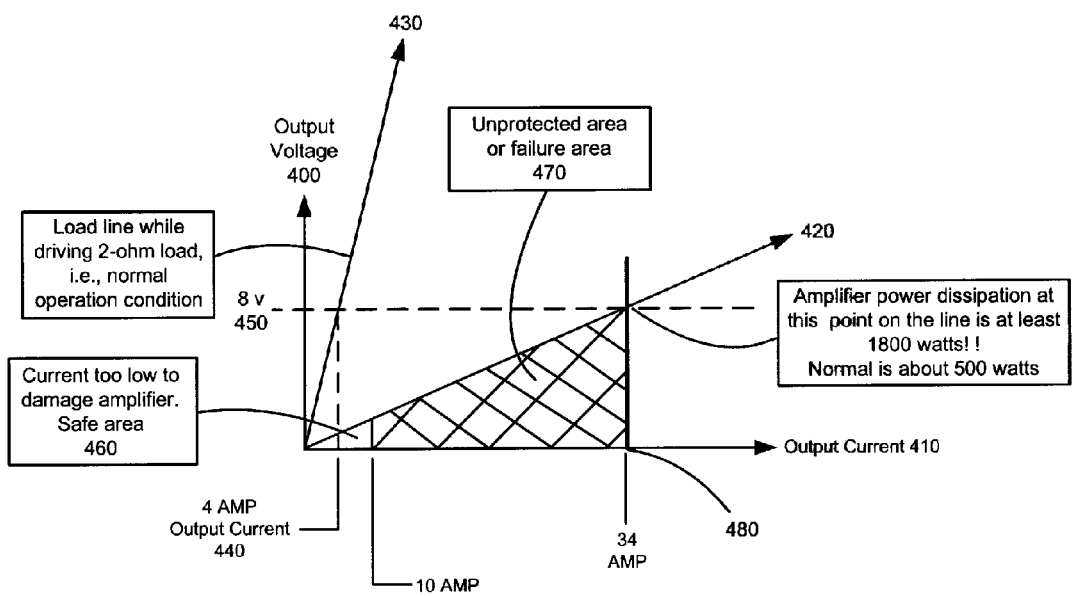
FIG. 4 is a diagram illustrating the failure data that is obtained when the present invention is applied to one specific type of amplifier.

One specific example of the foregoing procedure, performed upon 1500-watt class-D amplifier is shown in FIG. 4. The present invention is in no way limited to a specific type of amplifier, since all amplifiers share common characteristics, which can be taken advantage of by the present invention. FIG. 4 is for purposes of illustration only. FIG. 4 shows a graph having an X and Y axis. Output voltage 400 is represented along the Y axis and output current 410 is represented along the X axis. Line 420 shows the load while driving a short. Line 430 shows the system driving a 2 ohm load, which is normal operating condition.

Under normal operating conditions for this particular 1500 watt class D amplifier described in FIG. 4, a four amp output current 440 is associated with an 8 volt amplifier power dissipation level 450. In that case, the current is in a safe area 460 between 4 and 10 amps, which will not damage the amplifier. However, under non-normal operating condition, such as that shown on line 420 (which is driving a shorted speaker, for instance) the slope is reduced and the amplifier enters an unprotected zone 470 (or failure area). In this case, the 8 volt power dissipation level 450 is not reached until there are 1800 watts on the load line 420, where normal is at 500 watts. Consequently, in this scenario the pre-existing current protection threshold 480, which is always at 34 amps in the prior art, is not adequate and will allow damage to the amplifier without protection.

Figure 5:
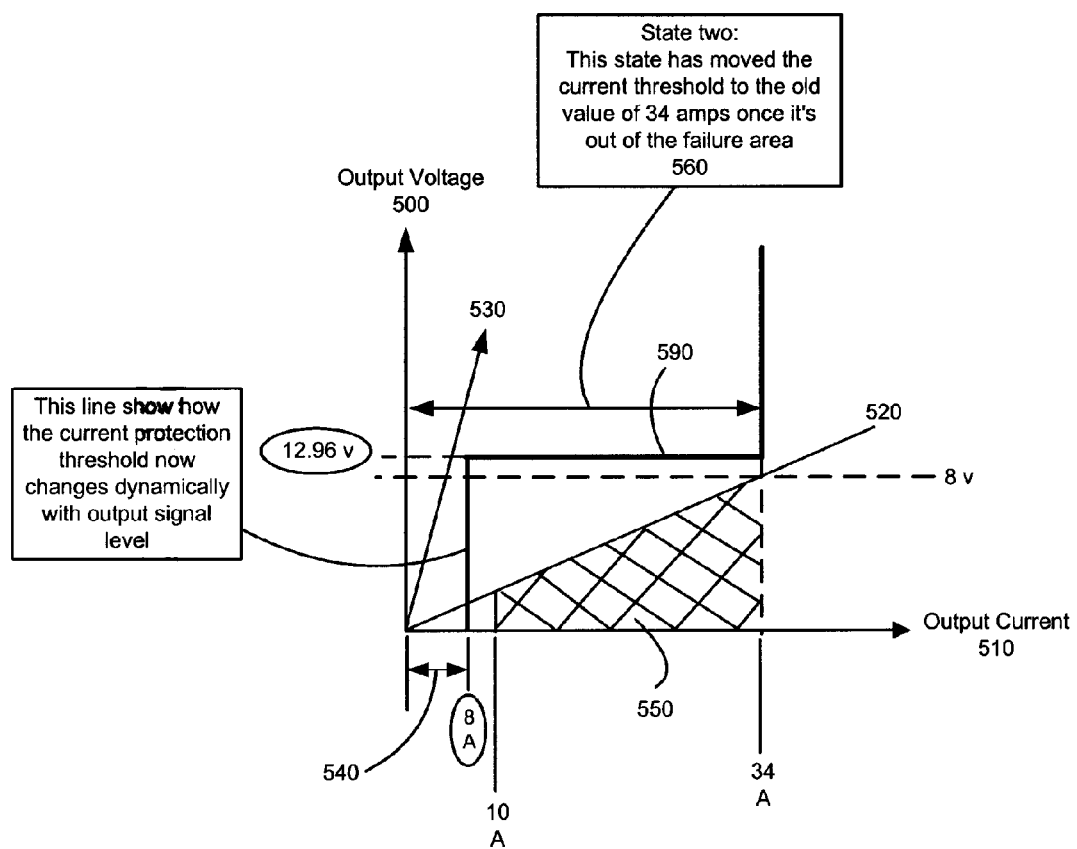
FIG. 5 is a diagram showing how to select parameters for a re-configurable amplifier protection circuit according to an embodiment of the present invention.

FIG. 5 is a diagram used to illustrate how parameters for a re-configurable amplifier protection circuit are selected as shown in step 210 of FIG. 2. The diagram of FIG. 5 shows a two state solution for simplicity, but a plurality of states are possible depending on the operating condition being tested for.

FIG. 5 shows a graph having an X and Y-axis. Output voltage 500 is represented along the Y-axis and output current 510 is represented along the X-axis. Line 520 shows the load while driving a short. Line 530 shows the system driving a 2 ohm load, which is normal operating condition. Line 540 represents a current protection circuit operating in a first state. In such a state, the current protection circuit 540 will not exceed 8 amps, which is safe, since line 530 (normal operating conditions will not reach this level. However, if the system operates as shown in line 520 (driving a short) it will reach the right side of line 540, which will cause the system to protect itself before it reaches area 550, which can cause damage to the amplifier.

Under normal conditions, protection circuit 540 will be transitioned dynamically into a second state at line 560, which is the conventional 34 amp protection area. Such a transition will occur when an event occurs. In this example such an event happens when the voltage reaches 12.96, as shown by line 590. It is also possible using the present invention to use a continuously variable configuration, unlike that shown with respect to FIG. 5, which does not have discrete states.

Figure 6:
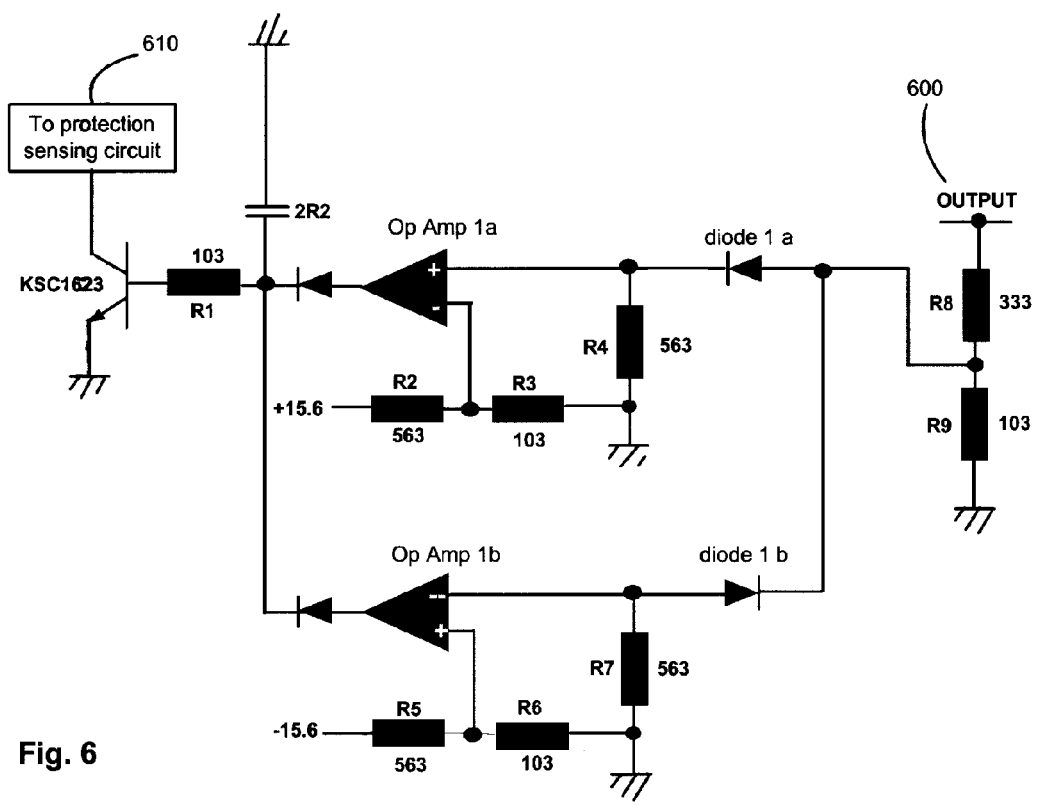
FIG. 6 is a circuit diagram for voltage detection using a two state solution according to an embodiment of the present invention.

FIG. 6 is a diagram of one embodiment of a re-configurable amplifier protection circuit that is designed, for instance as shown in step 240 of FIG. 2, to detect the output voltage of the amplifier and use that data to modulate the input current threshold for the amplifier. FIG. 6 is designed to receive an AC signal, a portion of which is positive at certain times and a portion of which is negative at certain times. The upper portion of FIG. 6 handles the signal at times when it is positive and the lower portion handles the signal at times when it is negative, so that the signal is handled at all times without any delay. Other circuit implementations may be implemented to achieve the same or a similar result.

Op Amp 1a and Op Amp 1b compare the rectified output 600 of the amplifier to the threshold. If the output level 600 is greater than the threshold, then Op Amp 1a or Op Amp 1b, depending on the nature of the AC signal at that time, output a high signal (or positive signal, which is used interchangeably herein). If the output level 600 is less then the threshold, then the output of Op Amp 1a or Op Amp 1b is low (or negative, which is used interchangeably herein). The high or low output signal of Op Amps 1a and 1b represent the two states that are used in the example embodiment, although it is understood that an arbitrary number of states may be added.

Whichever state the Op Amps 1a or 1b are in is sent to a protection sensing circuit 610 to modulate the current threshold. The threshold, by which the rectified output 600 is compared, is determined by the nature of resistors R3 and R4 and R6 and R7 respectively. In this example, using one example of a threshold, resistors R4 and R7 are 56 K-ohm resistors and R3 and R6 are 10 K-ohm resistors, but it is understood that resistors having different properties are used depending on the nature of the amplifier and the value of the threshold that is needed to protect the amplifier in different states.

The point when an event occurs, according, to one embodiment of the present invention, is derived in the equations below. It uses the values of the hardware as shown in FIG. 6 to arrive at a value of 12.96 volts as the point in which the system should re-configure itself from the first state to the second state. In general, the event is determined by equation 1:

$$Vout \approx \frac{\left(\frac{R3}{R2+R3}\right)(\text{supply voltage} + \text{drop across diodes})}{\left(\frac{R9}{R8+R9}\right)} \qquad \text{EQUATION 1}$$

where the supply voltage in the current example of FIG. 6 is (+or −) 15.6 volts, and the drop of 0.65 volts, results from diodes 1a and/or 1b. Equation 1 is solved as follows:

$$Vout \approx \frac{\left(\frac{R3}{R2+R3}\right)15.6 + 0.65}{\left(\frac{R9}{R8+R9}\right)}$$

$$Vout \approx \frac{\left(\frac{10K}{5.6K+10K}\right)15.6 + 0.65}{\left(\frac{10K}{10K+33K}\right)} \approx 12.96 \ v$$

Figure 7:
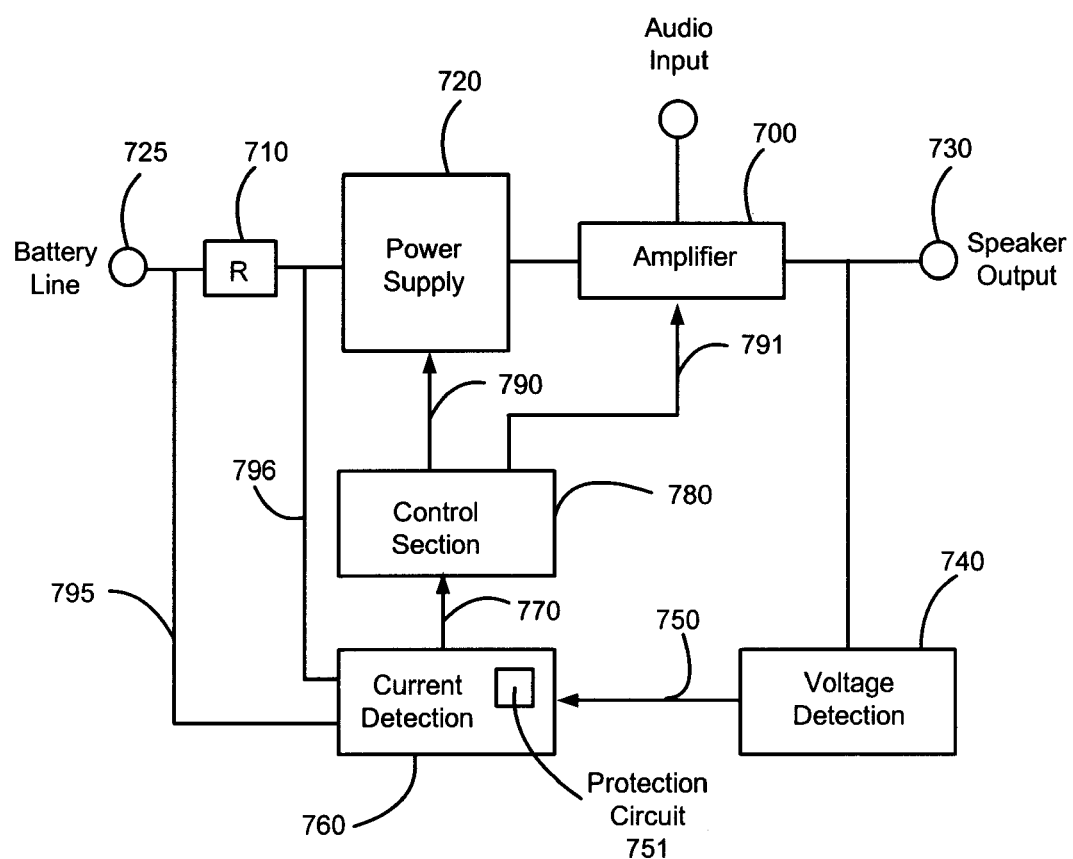
FIG. 7 is a block diagram showing the overall operation of a re-configurable amplifier protection circuit according to an embodiment of the present invention.

FIG. 7 is a block diagram showing the overall operation of a re-configurable amplifier protection circuit according to an embodiment of the present invention. Amplifier 700 represents any class of audio amplifier. Detection resistor 710 labeled "R" is of low resistance used to measure the amount of battery current flowing into the power supply 720 along battery line 725, which is routed along input current level lines 795 and 796 to a current detection circuit 760.

The power supply 720 is used to create bipolar high voltage for the audio amplifier stage. The amplifier 700 is connected to a speaker load through a speaker output terminal 730. A voltage detection circuit 740, detailed in FIG. 6, measures the output voltage level. Current threshold modulation control line 750 in a two state embodiment is digital and changes to a active state once the output level exceeds a predetermined threshold, determined by the voltage detection circuit 740. In a two-state system, for instance, the signal along line 750 changes the current detection threshold from low to high, which tells the protection circuit 751 to change the threshold.

Current detection circuit 760 uses line 750 to select two different thresholds for the input current, in the present two-state embodiment. If the selected threshold is exceeded, the current detection circuit 760 activates signal path 770, which triggers a shutdown sequence in control section 780. The shutdown sequence uses power supply shutdown line 790, which turns off power supply 720 and control section also activates amplifier control line 791, which shuts down the amplifier 700. Thus any damage to the amplifier is prevented, in this scenario using two thresholds that are relevant in different scenarios of amplifier operation.

Table 1 includes a truth table for the system diagram of FIG. 7. Under normal operating conditions, signal paths 790 and 791 are inactive and signal path 750 is active. Signal path 770 remains inactive and lines 795 and 796 indicate a high current level and the audio output level is high. In this case, the amplifier is functioning normally.

Under another normal operating condition, signal paths 790 and 791 are inactive and signal path 750 is also inactive. Signal path 770 remains inactive and lines 795 and 796 indicate a low current level and the audio output level is low. In this case, the amplifier is functioning normally.

Under operating conditions where the amplifier is driving a short, signal paths 790 and 791 are inactive transitioning to active and signal path 750 is active. Signal path 770 is also active and lines 795 and 796 indicate a high current level and the audio output level is high. In this case, the amplifier will transition to shutdown. Under another operating condition where the amplifier is driving a short, signal paths 790 and 791 are inactive transitioning to active and signal path 750 is inactive. Signal path 770 is also active and lines 795 and 796 indicate a high current level and the audio output level is low. In this case, the amplifier will transition to shutdown.

TABLE 1

| Operation Condition | Signal Path 790 & 791 (Amp Shutdown) | Signal Path 750 Change current threshold | Signal Path 770 Start shutdown sequence | Signal Path 795 & 796 Input Current (Level) | Audio Output (Level) | Amplifier Status |
|---|---|---|---|---|---|---|
| Normal | INACTIVE | ACTIVE | INACTIVE | High Level | High Level | Functioning normally |
| Normal | INACTIVE | INACTIVE | INACTIVE | Low Level | Low Level | Functioning normally |

TABLE 1-continued

| Operation Condition | Signal Path 790 & 791 (Amp Shutdown) | Signal Path 750 Change current threshold | Signal Path 770 Start shutdown sequence | Signal Path 795 & 796 Input Current (Level) | Audio Output (Level) | Amplifier Status |
| --- | --- | --- | --- | --- | --- | --- |
| Driving Short | INACTIVE transitioning to ACTIVE | ACTIVE | ACTIVE | High Level | High Level | Transitioning to Shutdown |
| Driving Short | INACTIVE transitioning to ACTIVE | INACTIVE | ACTIVE | High Level | Low Level | Transitioning to Shutdown |

Although the description above contains many specificities, these should not be construed as limiting the scope of the invention but as merely providing illustrations of some of the presently preferred embodiments of this invention. Thus the scope of this invention should be determined by the appended claims and their legal equivalents.

What is claimed is:

1. An amplifier circuit comprising:
   a) a current detection circuit for detecting current;
   b) a voltage detection circuit for detecting voltage;
   c) a logic circuit for selecting a current detection level based on level of the voltage;
   d) a dynamically variable reference level, wherein said current detection circuit measures supply current and compares it to said dynamically variable reference level; and
   e) a control circuit to shutdown the amplifier if said supply current exceeds said dynamically variable reference level.

2. The circuit recited in claim 1, wherein said current detection circuit supplies an active signal to said control circuit when said reference level is exceeded.

3. The circuit recited in claim 1, wherein said voltage detection circuit compares output voltage level to one or more predetermined reference levels.

4. The circuit recited in claim 3, wherein the said voltage detection circuit provides an output to be supplied to said current detection circuit to select said variable reference level.

5. An amplifier system comprising:
   a) current detection means for detecting current;
   b) voltage detection means for detecting voltage;
   c) logic means for selecting a current detection level based on level of the voltage;
   d) a dynamically variable reference level, wherein said current detection means measures supply current and compares it to said dynamically variable reference level; and
   g) control circuit means to shutdown said amplifier if said supply current exceeds said dynamically variable reference level.

6. The system recited in claim 5, wherein said current detection means supplies an active signal to said control means when said reference level is exceeded.

7. The system recited in claim 5, wherein said voltage detection means compares the output voltage level to one or more predetermined reference levels.

8. The system recited in claim 7, wherein the said voltage detection means provides an output to be supplied to said current detection means to select said variable reference level.

9. A method comprising:
   detecting current output from an amplifier;
   detecting voltage output from said amplifier;
   selecting a current detection level based on a level of said voltage output;
   measuring a supply current;
   comparing said supply current to a dynamically variable reference level; and
   shutting down said amplifier if said supply current exceeds said dynamically variable reference level.

10. The method of claim 9, wherein said step of detecting current output further comprises supplying an active signal when said reference level is exceeded.

11. The method claim 9, wherein said step of detecting voltage further comprises comparing said output voltage to one or more predetermined reference levels.

12. The method recited in claim 11, wherein said step of detecting voltage further comprises providing an output for selecting a variable current threshold.

* * * * *

UNITED STATES PATENT AND TRADEMARK OFFICE
CERTIFICATE OF CORRECTION

| | | |
|---|---|---|
| PATENT NO. | : 7,394,312 B2 | Page 1 of 1 |
| APPLICATION NO. | : 11/164201 | |
| DATED | : July 1, 2008 | |
| INVENTOR(S) | : Michael A. Schoenberger | |

It is certified that error appears in the above-identified patent and that said Letters Patent is hereby corrected as shown below:

Column 7, claim 3, line 40, after the word "compares" insert -- an --.

Signed and Sealed this

Twenty-fourth Day of February, 2009

JOHN DOLL
*Acting Director of the United States Patent and Trademark Office*